United States Patent
Lee et al.

(10) Patent No.: US 7,343,533 B2
(45) Date of Patent: Mar. 11, 2008

(54) HUB FOR TESTING MEMORY AND METHODS THEREOF

(75) Inventors: Kee-Hoon Lee, Suwon-si (KR); Seung-Man Shin, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 243 days.

(21) Appl. No.: 11/260,389

(22) Filed: Oct. 28, 2005

(65) Prior Publication Data
US 2006/0107156 A1 May 18, 2006

(30) Foreign Application Priority Data
Nov. 3, 2004 (KR) .................. 10-2004-0088702

(51) Int. Cl.
*G11C 29/00* (2006.01)
(52) U.S. Cl. ..................... 714/718; 714/739
(58) Field of Classification Search ............ 365/201; 714/715, 57, 5, 733, 718, 739
See application file for complete search history.

(56) References Cited

U.S. PATENT DOCUMENTS

| | | | |
|---|---|---|---|
| 5,258,986 A | 11/1993 | Zerbe | |
| 6,006,345 A | 12/1999 | Berry, Jr. | |
| 6,721,911 B1 * | 4/2004 | Marinissen et al. | 714/718 |
| 6,754,117 B2 * | 6/2004 | Jeddeloh | 365/201 |
| 6,769,084 B2 | 7/2004 | Kim et al. | 714/739 |
| 7,047,458 B2 * | 5/2006 | Nejedlo et al. | 714/715 |
| 7,191,368 B1 * | 3/2007 | Organ et al. | 714/57 |
| 7,210,059 B2 * | 4/2007 | Jeddeloh | 714/5 |

FOREIGN PATENT DOCUMENTS

| | | |
|---|---|---|
| DE | 102 06 189 | 5/2003 |
| EP | 1 241 678 | 9/2002 |

OTHER PUBLICATIONS

Joe Jeddeloh, "Fully Buffered (FB Dimm)", JEDEX, San Jose, Apr. 14-16, 2004, conference documents from the internet (status as of May 2, 2007) http://download.micron.com/pdf/presentations/jedex/fbdimm.micron.2004.pdf.
Office Action dated Oct. 23, 2007 (received by German associate on Nov. 29, 2007) for corresponding German Application No. 10 2005 051 308.5-55.

* cited by examiner

*Primary Examiner*—David Ton
(74) *Attorney, Agent, or Firm*—Harness, Dickey & Pierce, P.L.C.

(57) ABSTRACT

A hub for testing memory and methods thereof. The hub may include a test block a test block and a transparent mode block. The test block may be configured to generate a pseudo random pattern based on received memory control information and to write the pseudo random pattern to at least one of a plurality of memory devices in the first operating mode. The transparent mode block may be configured to receive the generated pseudo random pattern from the test block, to read the pseudo random pattern from the at least one of the plurality of memory devices in the first operating mode and to compare the generated pseudo random pattern with the read pseudo random pattern. Also, the hub may perform a transparent mode test on at least one memory device of a memory module with a pseudo random data pattern, the pseudo random data pattern based at least in part on memory control information received from a device not included within the memory module.

22 Claims, 5 Drawing Sheets

HUB FOR TESTING MEMORY AND METHODS THEREOF

PRIORITY STATEMENT

This application relies for priority upon Korean Patent Application No. 2004-88702 filed on Nov. 3, 2004, the contents of which are herein incorporated by reference in its entirety.

BACKGROUND OF THE INVENTION

1. Field of the Invention

Example embodiments of the present invention relate to a hub and methods thereof, and more particularly to a hub for testing memory and methods thereof.

2. Description of the Related Art

A plurality of memory devices in a memory module may be mounted on a printed circuit board (PCB) in a Single In-line Memory Module (SIMM) or a Dual In-line Memory Module (DIMM). A SIMM may include memory chips mounted on a single side of the PCB, while the DIMM may include memory chips mounted on both sides of the PCB. A DIMM may be classified as either a Fully Buffered DIMM (FBDIMM) or a Registered DIMM.

In microprocessor systems, the FBDIMM may be used to convert received higher-speed packets into memory commands. The FMDIMM may also be used to synchronize incoming/outgoing signals.

A FBDIMM memory system may include a plurality of slots and a plurality of FBDIMMs mounted on the slots. The plurality of FBDIMMs may be tested separately (e.g., before being mounted) in order to determine whether the mounted FBDIMMs will operate normally.

FBDIMM channel architecture may use a point-to-point connection or protocol and FBDIMM memory systems may not depend on an input/output (I/O) speed of a Dynamic Random Access Memory (DRAM), which may allow a higher number of modules to be mounted on the FBDIMM memory system. Unlike Registered DIMMs, FBDIMMs may include a hub in place of a Phase Locked Loop (PLL) and register combination.

The FBDIMM hub may receive packets and may de-packetize the received packets (e.g., extract information from the received packets) to provide addresses, memory commands and/or data to a plurality of memory devices mounted on the FBDIMM. The hub may packetize data (e.g., collect data and generate data packets with the collected data) received from the memory device and may output the packetized data to a host.

The FBDIMM hub may include a memory Built-In Self Test (BIST) circuit for testing the memory device. The BIST circuit may include a logic circuit for generating a test pattern. In the FBDIMM, the memory device may be tested using a BIST circuit or, alternatively, a transparent mode test.

A special mode selection signal may be received at a conventional BIST circuit from outside the memory module (e.g., the FBDIMM) which may trigger test logic, stored in the hub, to test the memory device. The test logic may test the memory device by generating a pseudo random test pattern using a fixed test pattern (e.g., stored in the hub), a Linear Feedback Shift Register (LFSR), etc.

In the transparent mode test, an address, a memory command and test data may be received from a test apparatus (e.g., an external device) and may be written directly to the memory device in response to a control signal. The hub may relay the received signals (e.g., address, memory command, test data, etc.) to the memory device. Thus, the hub need not de-packetize the received signals (e.g., address, memory command, test data, etc.) in the transparent mode test. In the transparent mode test, the hub may read test data from the memory device to be tested and may compare the read test data with the generated test data. If the comparison indicates a match, a PASS signal may be generated. Otherwise, if the comparison does not indicate a match, a FAIL signal may be generated.

In the conventional transparent mode test, the test data pattern may not be generated from the hub of the memory module, but rather may be received from an external test apparatus (e.g., not part of the FBDIMM). Because of hardware complexity, it may be difficult to include the LFSR for generating the pseudo random pattern in the external testing apparatus. Thus, in the conventional transparent mode test, the memory device may be tested with a fixed data pattern, and not a random data pattern. Testing memory devices with non-random data may be less effective as compared to random data testing.

SUMMARY OF THE INVENTION

An example embodiment of the present invention is directed to a method of testing memory, including receiving memory control information in accordance with an operating mode, generating a pseudo random pattern based at least in part on the received memory control information and the operating mode, writing the pseudo random pattern to at least one memory device based on the memory control information, reading the pseudo random pattern from the at least one memory device and comparing the read pseudo random pattern with the generated pseudo random pattern.

Another example embodiment of the present invention is directed to a hub configured to receive memory control information in accordance with a first operating mode and a second operating mode, including a test block configured to generate a pseudo random pattern based on received memory control information and to write the pseudo random pattern to at least one of a plurality of memory devices in the first operating mode and a transparent mode block configured to receive the generated pseudo random pattern from the test block, to read the pseudo random pattern from the at least one of the plurality of memory devices in the first operating mode and to compare the generated pseudo random pattern with the read pseudo random pattern.

Another example embodiment of the present invention is directed to a method of testing memory, including performing a transparent mode test on at least one memory device of a memory module with a pseudo random data pattern, the pseudo random data pattern based at least in part on memory control information received from a device not included within the memory module.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

DETAILED DESCRIPTION OF EXAMPLE EMBODIMENTS OF THE PRESENT INVENTION

Figure 1:
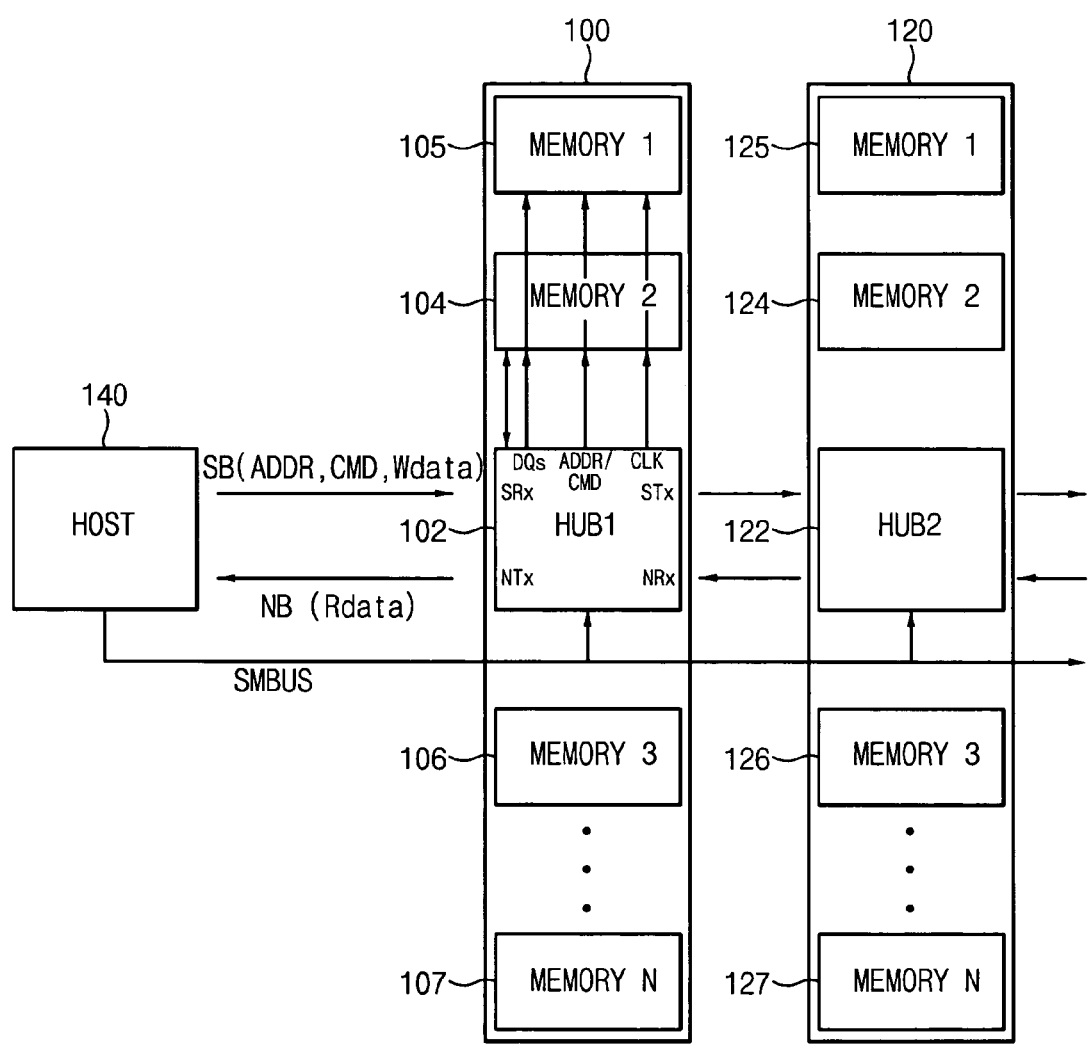
FIG. 1 is a block diagram illustrating a memory system according to an example embodiment of the present invention.

Hereinafter, example embodiments of the present invention will be described in detail with reference to the accompanying drawings.

In the Figures, the same reference numerals are used to denote the same elements throughout the drawings.

FIG. 1 is a block diagram illustrating a memory system 150 according to an example embodiment of the present invention.

In the example embodiment of FIG. 1, the memory system 150 may include a first memory module 100 connected to a second memory module 120 and further connected to a host 140. In an example, the host 140 may be a memory test apparatus (e.g., an external device).

In the example embodiment of FIG. 1, the first and second memory modules 100 and 120 may include first and second hubs 102 and 122, respectively, and a first and a second plurality of memory devices 104/105/106/107 and 124/125/126/127, respectively. While the first and second memory modules 100 and 120 are collectively illustrated as including eight memory devices in FIG. 1, it is understood that other example embodiments of the present invention may employ any number of memory devices (e.g., greater or fewer than eight) and/or any number of memory modules (e.g., greater or fewer than two).

In the example embodiment of FIG. 1, the host 140 may transfer a southbound packet SB to the first and second memory modules 100 and 120 (e.g., at higher speeds). The southbound packet SB may include an address ADDR, a memory command CMD and a write data Wdata. The southbound packet SB may be transferred to the first hub 102 of the first memory module 100. The southbound packet SB may alternatively bypass processing at the first hub 102 of the first memory module 100 and may be transferred from the host 140 directly to the second hub 122 from the first hub 102. Thus, the southbound packet SB may be selectively transferred to at least one of the first and second memory modules 100 and 120.

In the example embodiment of FIG. 1, the southbound packet SB may include a recognition code (e.g., a Dual In-line Memory Module (DIMM) recognition code). Each of the first and second memory modules 100 and 120 may analyze the recognition code in the received southbound packet SB and may selectively process information included in the southbound packet SB (e.g., if the recognition code identifies at least one of the memory devices 104/105/106/107/124/125/126/127 present in the first/second memory modules 100/120).

An example operation of the memory system 150 of FIG. 1 will now be given. In the example operation of the memory system 150 of FIG. 1, if the southbound packet SB includes a recognition code associated with the first memory module 100, the first hub 102 may process information in the southbound packet SB and may transfer the processed information to the first plurality of memory devices 104/105/106/107. Memory modules not associated with the recognition code of the southbound packet SB may bypass (e.g., relay, transfer, etc.) the received southbound packet SB without additional processing.

In the example operation of the memory system 150 of FIG. 1, the first hub 102 of the first memory module 100 may process (e.g., de-packetize or extract packets from) the received southbound packet SB and may transfer data, an address/command and/or a clock signal (e.g., extracted from the southbound packet SB) to a corresponding memory device (e.g., one or more of memory devices 104/105/106/107) through data DQ pins, address/command (ADDR/CMD) pins and a memory clock CLK pin, respectively.

In the example embodiment of FIG. 1, the first and second hubs 102 and 122 may be included among a plurality of hubs in a plurality of modules (e.g., in addition to the first and second memory modules 100 and 120) connected to the host 140 through a system management bus (SMBUS) and each of the plurality of hubs may receive operation control signals designating operations for the hubs. For example, the operation control signals may include a transparent mode selection signal.

In the example embodiment of FIG. 1, the southbound packet SB may be received through a southbound receiving port SRx at each of the plurality of hubs (e.g., hub 102, hub 122, etc.) and may be output through a southbound transmitting port STx. The southbound packet SB may be output through the southbound transmitting port STx of the first hub 120 and may be received at the second hub 122 through the southbound receiving port SRx. The second hub 122 may output the received southbound packet SB through the southbound transmitting port STx of the second hub 122 (e.g., to a next hub (not shown)). In an example, the above-described southbound packet transfer may continue through each of the plurality of hubs during a single reference clock cycle (e.g., based on a clock signal received through a separate transmission line (not shown)).

In the example embodiment of FIG. 1, data may be capable of being written to each of the first and second memory modules 100 and 120. In an example, if a first data write operation completes at the first memory module 100, a second data write operation may then be performed at the second plurality of memory modules 120 (e.g., in the same clock cycle, at subsequent clock cycles, etc.). This process may continue at other memory modules (not shown). Data write operations may thereby be sequentially performed (e.g., one after the other) at a number of memory modules, where each of the memory modules may be connected directly and/or indirectly (e.g., through hubs of other memory modules) to the host 140.

In the example embodiment of FIG. 1, if a data read operation is performed on a memory device selected by the memory command CMD included in the southbound packet SB, the data read from the selected memory device (e.g., one of the first plurality of memory devices 104/105/106/107, etc.) may be transferred to the host 140 directly and/or indirectly (e.g., through a "daisy chain" of hubs in the respective memory modules 100/120). The data output from the selected memory device to the host 140 may be transferred as a packet, hereinafter referred to as a northbound packet NB. The hub associated with the selected memory module may collect (e.g., packetize) information to be transferred in the northbound packet NB and may output the northbound packet NB through a northbound transmitting port NTx. The output northbound packet NB may be received by a northbound port NRx of an adjacent memory module (e.g., at the first hub 102, at the second hub 122, etc.) and may be transferred to the host 140 (e.g., through a series of adjacent, daisy chained hubs).

In the example embodiment of FIG. 1, if the transparent mode selection signal received from the host 140 through the SMBUS is enabled, each of the plurality of hubs (e.g., first hub 102, second hub 122, etc.) may perform a memory test in a transparent mode. A transparent mode test according to example embodiments of the present invention is described below with reference to FIGS. 2 through 4.

Figure 2:
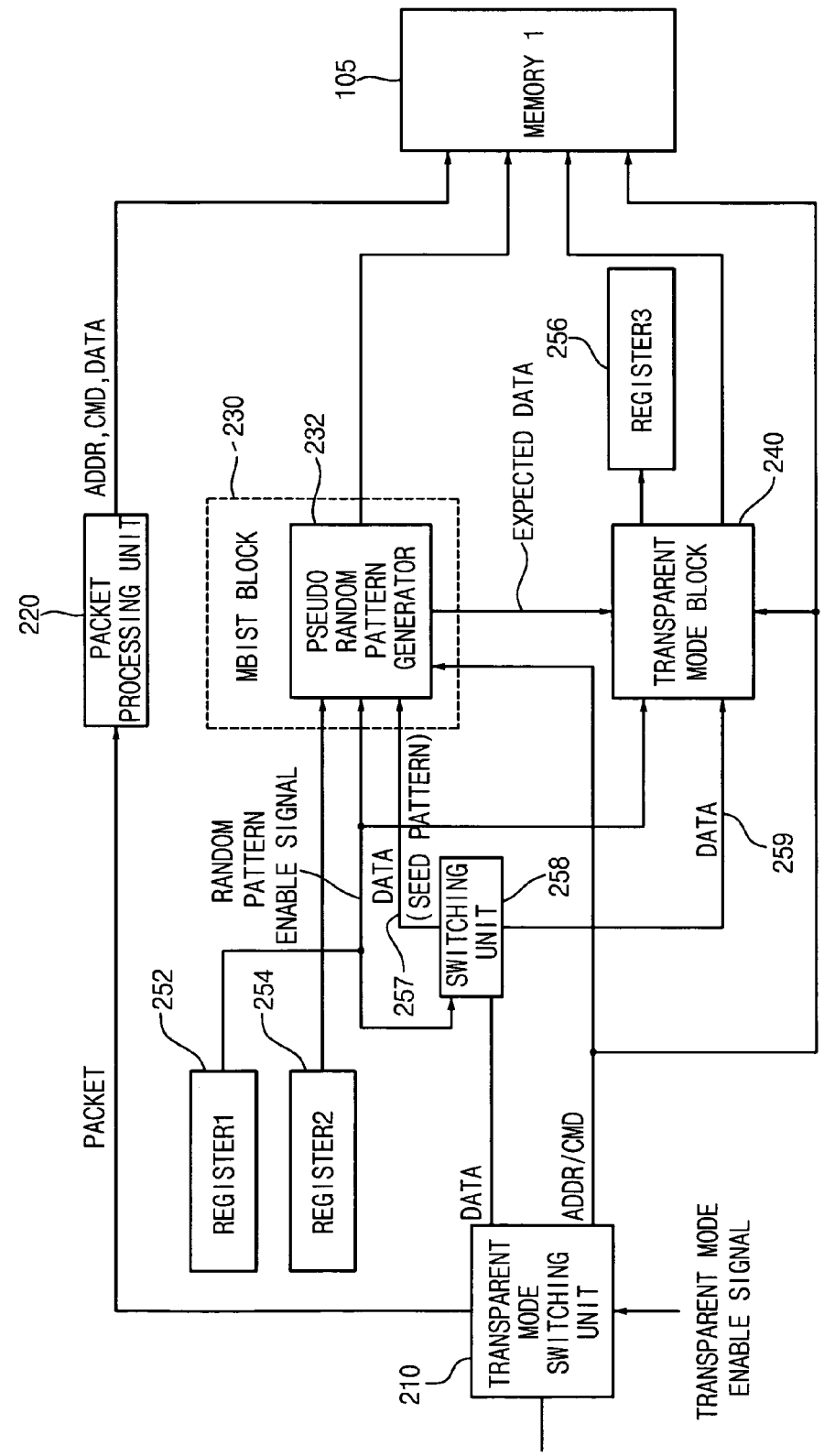
FIG. 2 is a block diagram of a hub according to another example embodiment of the present invention.

FIG. 2 is a block diagram of a hub 200 according to another example embodiment of the present invention. In an example, the hub 200 of FIG. 2 may be representative of the first and second hubs 100 and 120 of FIG. 1 and/or other hubs (not shown) connected to the host 140 of FIG. 1.

In the example embodiment of FIG. 2, the hub 200 may include a transparent mode switching unit 210, a packet processing unit 220, a Memory Built-In Self Test (MBIST) block 230, a transparent mode block 240, a switching unit 258 and registers 252, 254 and 256.

In the example embodiment of FIG. 2, the transparent mode switching unit 210 may determine a status of a transparent mode enable signal received from the host 140 through the SMBUS. If the transparent mode switching unit 210 determines that the transparent mode enable signal is in an inactive state (e.g., based on a logic level of the transparent mode enable signal), the transparent mode switching unit 210 may interpret the transparent mode enable signal as indicating a normal operation mode. Otherwise, if the transparent mode switching unit 210 determines that the transparent mode enable signal is in an active state, the transparent mode switching unit 210 may interpret the transparent mode enable signal as indicating a transparent mode.

In the example embodiment of FIG. 2, if the transparent mode switching unit 210 interprets the transparent mode enable signal as indicating a normal operation mode, the transparent mode switching unit 210 may receive an input signal from the host 140 through the southbound receiving port SRx and may transfer the received input signal to the packet processing unit 220 as a packet. The packet processing unit 220 may process (e.g., de-packetize) the transferred packet so as to extract memory control information (e.g., a memory command CMD, an address ADDR, and data DATA), which may thereby be transferred at the memory device 105. While described below as being transferred to the memory device 105, it is understood that the memory control information may be transferred to any memory device in any of the memory modules illustrated in FIG. 1.

In the example embodiment of FIG. 2, if the transparent mode switching unit 210 interprets the transparent mode enable signal as indicating a transparent mode, the transparent mode switching unit 210 may receive the memory control information (e.g., memory command CMD, an address ADDR and data DATA) from the host 140 through the SMBUS and may transfer/relay the received memory control information directly to the memory device 105 without having to de-packetize a received packet. In an example, the memory command CMD may indicate a READ command, a WRITE command, or any other well-known memory command.

In the example embodiment of FIG. 2, if the transparent mode switching unit 210 interprets the transparent mode enable signal as indicating a transparent mode, the transparent mode switching unit 210 may transfer the received memory control information (e.g., including a memory command and associated address), which may be received at the southbound receiving port SRx port from the host 140 through the SMBUS, to the memory device 105 without having the memory control information pass through the packet processing unit 220. In addition, the transparent mode switching unit 210 may also transfer data (e.g., included among the memory control information) to the switching unit 258.

In the example embodiment of FIG. 2, if the transparent mode switching unit 210 interprets the transparent mode enable signal as indicating a transparent mode, the switching unit 258 may transfer the data from the received memory control information to at least one of a pseudo random pattern generator 232 and a transparent mode block 240 based on the random pattern enable signal. For example, if the random pattern enable signal is set to a first logic level (e.g., a higher logic level or logic "1"), the data from the memory control information received from the transparent mode switching unit 210 may be transferred as a seed pattern through a first path 257 to the pseudo random pattern generator 232. Otherwise, if the random pattern enable signal is set to a second logic level (e.g., a lower logic level or logic "0"), the data from the memory control information, received from the transparent mode switching unit 210, may be transferred through a second path 259 to the transparent mode block 240.

In the example embodiment of FIG. 2, the MBIST block 230 may perform a BIST operation and may include the pseudo random pattern generator 232. The pseudo random pattern generator 232 may generate a pseudo random pattern in response to a pseudo random enable signal. In an example, the pseudo random pattern generator 232 may be implemented as a linear feedback shift register (LFSR). The LFSR may generate the pseudo random pattern based on the seed pattern received via the first path 257.

In the example embodiment of FIG. 2, the random pattern enable signal may be generated using a bit or logic value (e.g., the first logic level or logic "1", the second logic level or logic "0", etc.) stored in the first register 252 of the hub 200. If the bit value stored in the first register 252 is set to the first logic level, the random pattern enable signal may be interpreted as being activated and the pseudo random pattern generator 232 may generate the pseudo random pattern. Alternatively, if the bit value stored in the first register 252 is set to the second logic level, the random pattern enable signal may be interpreted as not being activated and the pseudo random pattern generator 232 may not generate the pseudo random pattern.

In the example embodiment of FIG. 2, if the random pattern enable signal is interpreted as being activated, the seed pattern may be based on the data received from the switching unit 258. Alternatively, the seed pattern may be based on a stored seed pattern read from the second register 254 of the hub 200.

In the example embodiment of FIG. 2, the pseudo random pattern generator 232 may apply the generated pseudo random pattern to the memory device 105 in response to a WRITE command. Alternatively, in response to a READ command, the pseudo random pattern generator 232 may delay the pseudo random pattern from being generated by a delay period based on when the READ command may be scheduled to be applied at the memory device 105. The delayed pseudo random pattern may be applied after the delay period to the comparator 242. The pseudo random pattern may thereby be read from the memory device 105 in response to the READ command and may be transferred to the transparent mode block 240.

In the example embodiment of FIG. 2, if the transparent mode switching unit 210 interprets the transparent mode enable signal as indicating a transparent mode and the random pattern enable signal is interpreted as being activated (e.g., set to the first logic level), the transparent mode block 240 may read the pseudo random pattern from the memory device 105 and may test the memory device 105 by comparing the read pseudo random pattern with expected data (e.g., the generated pseudo random pattern) received from the pseudo random pattern generator 232. Alternatively, if the transparent mode switching unit 210 interprets the transparent mode enable signal as indicating a transparent mode and the random pattern enable signal is interpreted as not being activated (e.g., set to the second logic level), the transparent mode block 240 may receive the output data of the switching unit 258 through the second path 259 in response to a WRITE command and may transfer the received data to the memory device 105.

Figure 3:
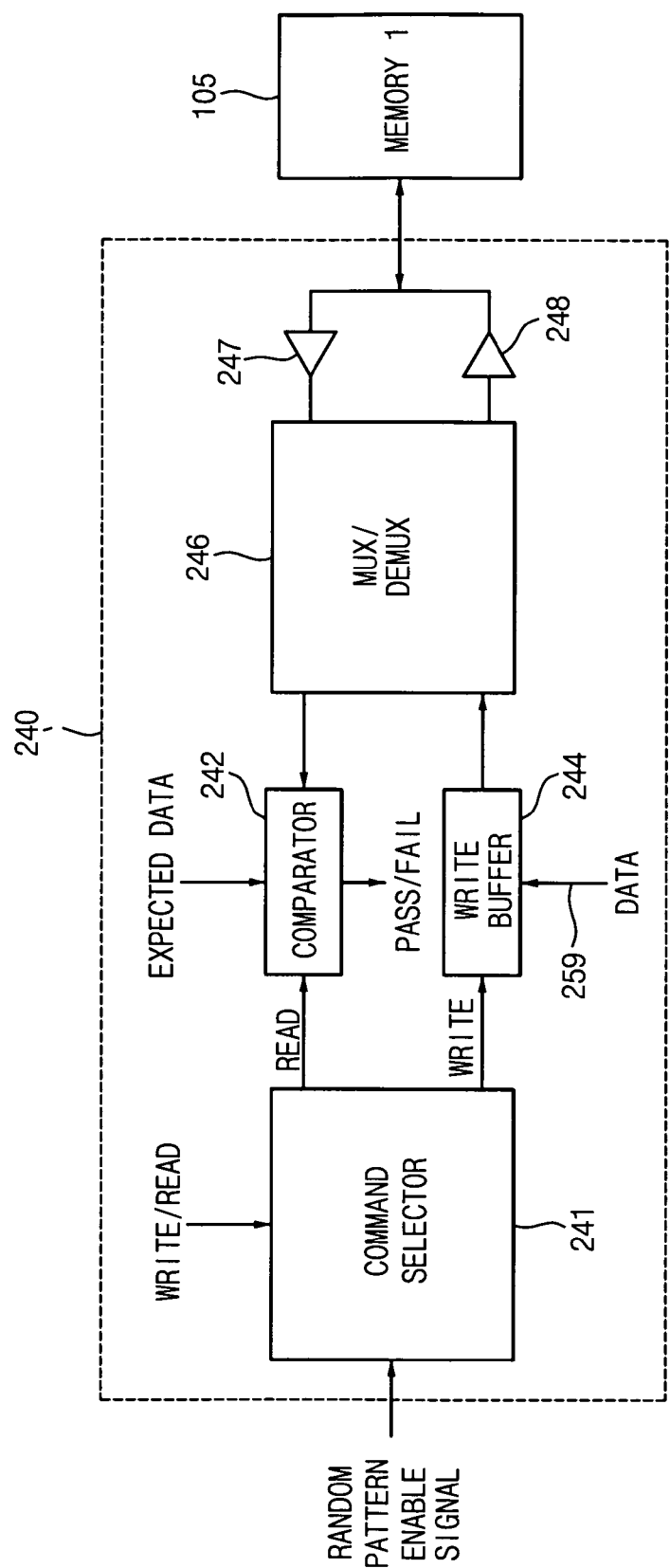
FIG. 3 is a block diagram of a transparent mode block in communication with a memory device according to another example embodiment of the present invention.

FIG. 3 is a block diagram of the transparent mode block 240 in communication with the memory device 105 according to another example embodiment of the present invention.

In the example embodiment of FIG. 3, the transparent mode block 240 may include a command selector 241, a comparator 242, a write buffer 214, a multiplexer/de-multiplexer (MUX/DEMUX) 246 and buffers 247 and 248.

In the example embodiment of FIG. 3, if the random pattern enable signal is interpreted as being activated (e.g., set to the first logic level), the command selector 241 may select a READ command and may transfer the selected READ command to the comparator 242. Alternatively, if the random pattern enable signal is interpreted as not being activated (e.g., set to the second logic level), the command selector 241 may select a WRITE command and may transfer the WRITE command to the write buffer 244.

In the example embodiment of FIG. 3, in response to the READ command, the comparator 242 may read the pseudo random pattern from the memory device 105 through the buffer 247 and the MUX/DEMUX 246. The memory device 105 may be tested by comparing the read pseudo random pattern with the expected data (e.g., the generated pseudo random pattern) received from the pseudo random pattern generator 232. If the pseudo random pattern read from the memory device 105 matches the expected data, the comparator 242 may generate a PASS signal. Alternatively, if the pseudo random pattern read from the memory device 105 does not match the expected data, the comparator 242 may generate a FAIL signal. The generated signal (e.g., the PASS signal or the FAIL signal) may be stored in the third register 256 of the hub 200. The generated signal may be transferred to the host 140 to indicate a success or failure of the memory device 105.

In the example embodiment of FIG. 3, in response to the WRITE command, the write buffer 244 may receive the data from the switching unit 258 through the second path 259 and may transfer the received data from the switching unit 258 to the memory device 105 through the MUX/DEMUX 246 and the buffer 248.

Figure 4:
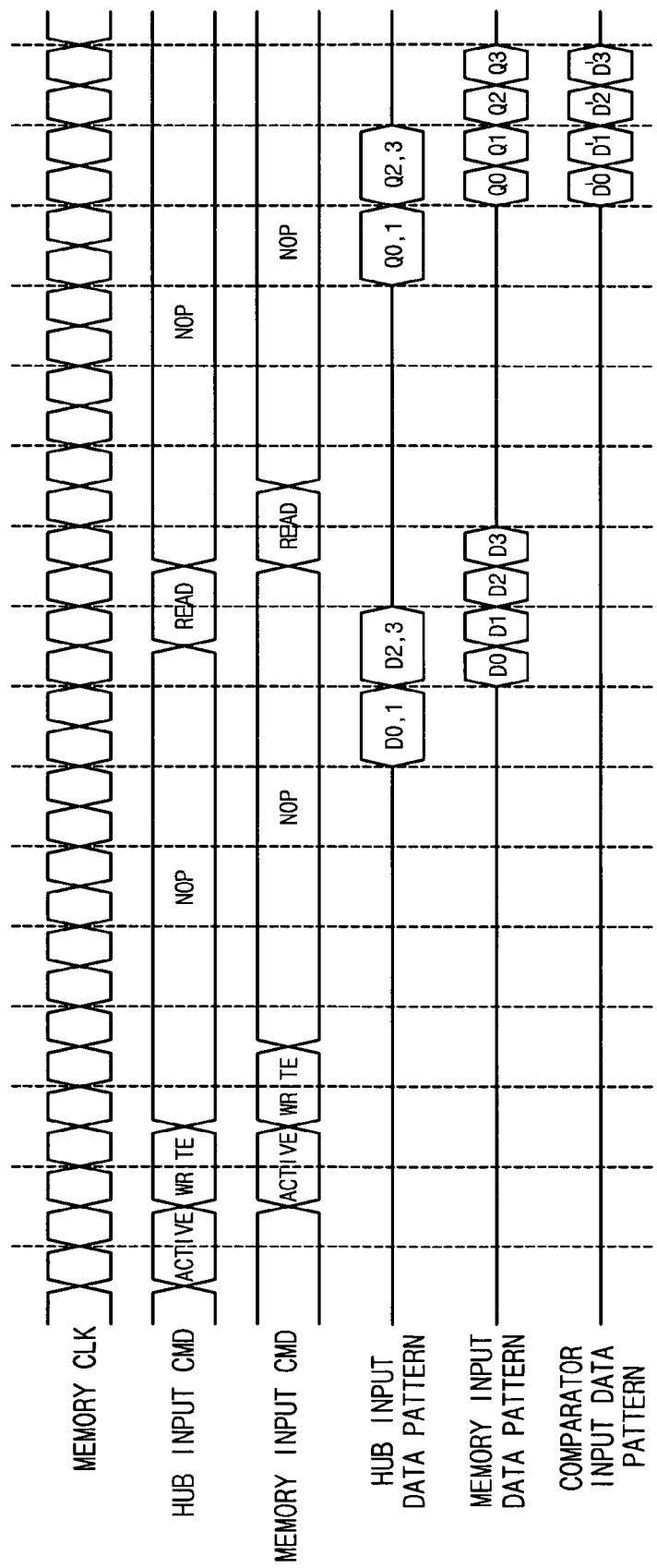
FIG. 4 is a timing diagram of a transparent mode test operation according to another example embodiment of the present invention.

FIG. 4 is a timing diagram of a transparent mode test operation according to another example embodiment of the present invention.

In the example embodiment of FIG. 4, a memory clock signal CLK may be received at each memory device of the first and second memory modules 100/120 of FIG. 2 through a clock pin (not shown), and the command CMD may be received at a hub (e.g., hub 102, 122, etc.) in synchronization with the memory clock CLK. The command CMD received at the hub may be delayed by a delay time and may be applied to the memory device after the delay time in synchronization with the memory clock CLK. For example, the command CMD applied to the memory device may be delayed by one or more clock cycles of the memory clock CLK.

In the example embodiment of FIG. 4, data may be transferred to the hub (e.g., hub 102, 122, etc.) from the memory device in response to the command CMD. The packet data (D0, 1) and (D2, 3) may be transferred to the hub (e.g., hub 102, 122, etc.) in response to a WRITE command received at the memory device. In the transparent mode, the data may be transferred to the memory device through the write buffer 244, the MUX/DEMUX 246 and the buffer 248 in an order of D0, D1, D2 and D3. The memory device may receive a READ command and may output data Q1, Q2, Q3 and Q4 in response to the received READ command. The data Q1, Q2, Q3 and Q4 may be transferred to the comparator 242 through the buffer 247 and the MUX/DEMUX 246. The data (DO, 1) and (D2, 3) may be transferred to the hub (e.g., hub 102, 122, etc.) and may be delayed by a delay time (e.g., one or more clock cycles of the memory clock CLK). The delayed data (D0, 1) and (D2, 3) may be received at the comparator 242. The comparator 242 may compare the data D0', D1', D2' and D3', received from the pseudo random pattern generator 232, with the data Q0, Q1, Q2 and Q3. The comparator 242 may a comparison result indicating whether the compared data may be the same to the host 140. The data D0', D1', D2' and D3' received from the pseudo random pattern generator 232 may be delayed so as to synchronize the delayed data D0', D1', D2' and D3' with the data Q0, Q1, Q2 and Q3 received from the memory device 105, and the synchronized data may then be transferred to the comparator 242.

Figure 5:
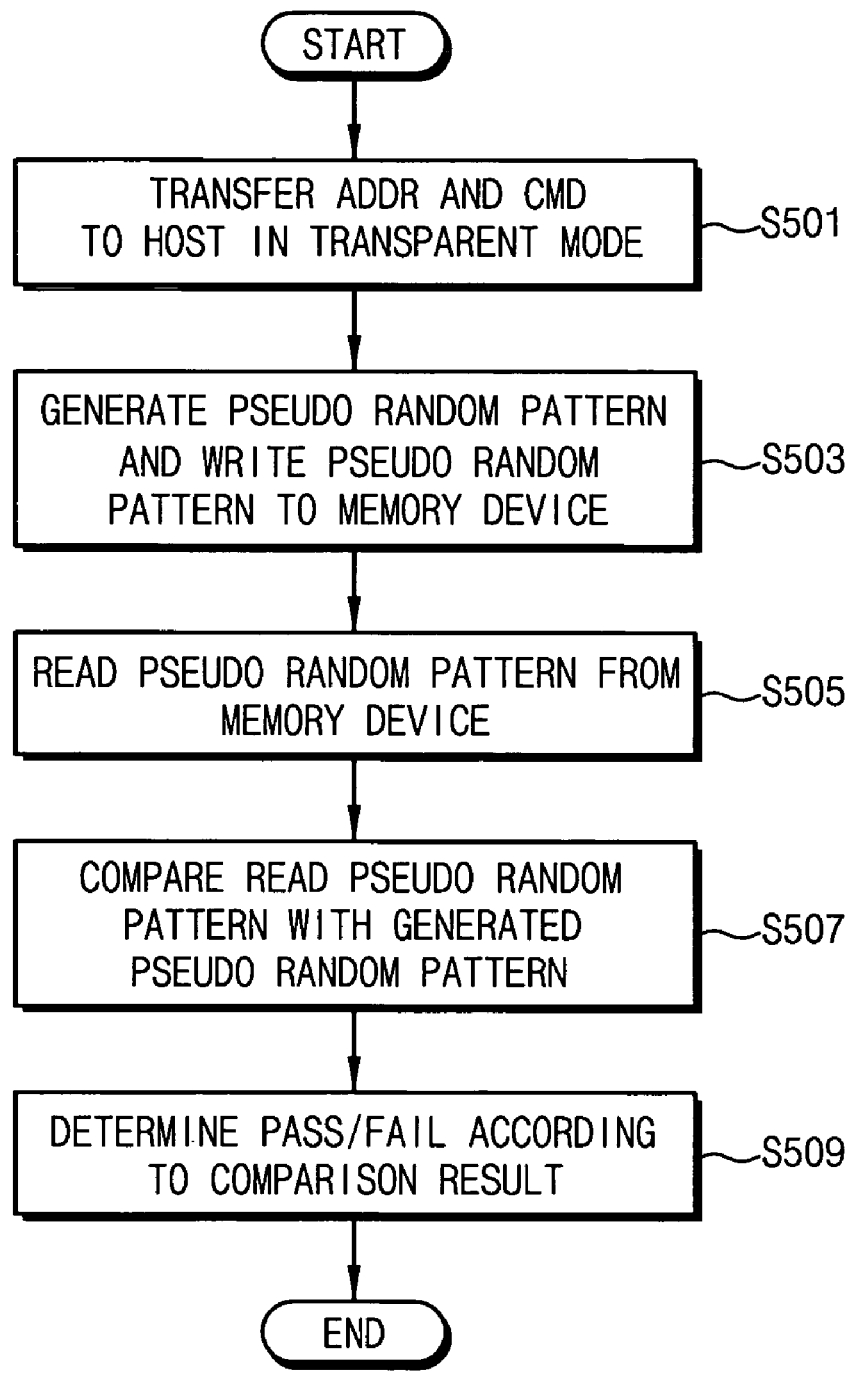
FIG. 5 is a flowchart illustrating a transparent mode test operation according to another embodiment of the present invention.

FIG. 5 is a flowchart illustrating a transparent mode test operation according to another embodiment of the present invention.

In the example embodiment of FIG. 5, a hub (e.g., hub 102, 122, etc.) may transfer received memory control information (e.g., including address ADDR and the command CMD) from the host 140 to the memory device 105 without processing (e.g., without de-packetizing) (at S501). The hub may generate a first pseudo random pattern (e.g., expected data), for example by using data received from the host 140 as a seed pattern for the random sequence or pattern, and may write the first pseudo random pattern to the memory device 105 (at S503).

In the example embodiment of FIG. 5, the hub may read a second pseudo random pattern corresponding to the stored first pseudo random pattern from the memory device 105 (at S505). The comparator 242 of the hub may compare the first pseudo random pattern (e.g., the expected data) with the second pseudo random pattern (at S507). The hub may generate a PASS signal or a FAIL signal indicating whether the compared data is the same based on the results of the comparison (at S509).

In another example embodiment of the present invention, a memory device operating in accordance with a test mode may receive an address and a command (e.g., a write command, a read command, etc.) directly from an external device and may use a pseudo random pattern generated in a BIST circuit of a hub (e.g., hub 102, 122, etc.) as a test pattern. A range of the memory test may be increased if the test mode operates in accordance with a transparent mode test.

Example embodiments of the present invention being thus described, it will be obvious that the same may be varied in many ways. For example, it is understood that the above-described first and second logic levels may correspond to a higher logic level (e.g., logic "1") and a lower logic or level (e.g., logic "0"), respectively, in an example embodiment of the present invention. Alternatively, the first and second logic levels may correspond to the lower logic level (e.g., logic "0") and the higher logic level (e.g., logic "1"), respectively, in other example embodiments of the present invention.

Further, while FIG. 2 illustrates two memory modules 100/100, two hubs 102/122, and four memory devices in each of the memory modules 100/100, it is understood that other example embodiment of the present invention may include any number of memory modules, hubs and/or memory devices. Further, while testing operating according to example embodiments of the present invention are above described with reference to the memory device 105, it is understood that other example embodiments of the present invention may test any memory device (e.g., memory device 106, 107, etc.) in any memory module (e.g., memory module 120) in other example embodiments of the present invention.

Such variations are not to be regarded as departure from the spirit and scope of example embodiments of the present invention, and all such modifications as would be obvious to one skilled in the art are intended to be included within the scope of the following claims.

What is claimed is:

1. A method of testing memory, comprising:
receiving memory control information in accordance with an operating mode;
generating a pseudo random pattern based at least in part on the memory control information and the operating mode;
writing the pseudo random pattern to at least one memory device based on the memory control information;
reading the pseudo random pattern from the at least one memory device; and
comparing the read pseudo random pattern with the generated pseudo random pattern.

2. The method of claim 1, wherein the memory control information includes data, an address and a memory command.

3. The method of claim 1, wherein the memory control information is received from a host.

4. The method of claim 1, wherein the operating mode operates in accordance with one of a transparent mode test and a normal operation mode.

5. The method of claim 1, wherein the pseudo random pattern is generated based at least in part on data received as a part of the memory control information.

6. The method of claim 1, further comprising:
delaying the generated pseudo random pattern by a time delay such that the delayed generated pseudo random pattern is synchronized with the read pseudo random pattern.

7. The method of claim 6, wherein the time delay is one or more clock cycles.

8. The method of claim 1, wherein the comparing determines whether the read pseudo random pattern and the generated pseudo random pattern are the same.

9. The method of claim 8, further comprising:
generating a status signal based on the comparing, the status signal indicating success if the comparing determines that the read pseudo random pattern and the generated pseudo random pattern are the same and indicating failure if the comparing determines that the pseudo random pattern and the generated pseudo random pattern are not the same.

10. A hub for performing the method of claim 1.

11. A hub configured to receive memory control information in accordance with a first operating mode and a second operating mode, comprising:
a test block configured to generate a pseudo random pattern based on received memory control information and to write the pseudo random pattern to at least one of a plurality of memory devices in the first operating mode; and
a transparent mode block configured to receive the generated pseudo random pattern from the test block, to read the pseudo random pattern from the at least one of the plurality of memory devices in the first operating mode and to compare the generated pseudo random pattern with the read pseudo random pattern.

12. The hub of claim 11, wherein the test block is a Built-In Self Test (BIST) block.

13. The hub of claim 11, further comprising:
a packet processing unit configured to extract the memory control information from a packet in the second operating mode.

14. The hub of claim 11, wherein the memory control information includes a packet with an address, a memory command and data in the first operation mode and the memory control information includes the address, the memory command and the data in the second operating mode.

15. The hub of claim 11, further comprising:
a switching unit configured to, in the second operating mode, receive data, configured to transfer the received data through a first path when a random pattern enable signal is set to a first logic level and configured to transfer the received data through a second path when the random pattern enable signal is set to a second logic level.

16. The hub of claim 15, wherein the test block includes a linear feedback shift register (LFSR) configured to generate the generated pseudo random pattern based on the received data on the second path.

17. The hub of claim 15, wherein the transparent mode block includes a write buffer configured to receive the received data on the second path and to write the receive data into the at least one of the plurality of memory devices.

18. The hub of claim 11, wherein the test block delays the generated pseudo random pattern by a time delay such that the generated pseudo random pattern is synchronized with the read pseudo random pattern.

19. The hub of claim 11, wherein the transparent mode block includes a comparator configured to determine whether the read pseudo random pattern matches the generated pseudo random pattern.

20. A memory module, comprising:
the hub of claim 11; and
the plurality of memory devices.

21. A method of testing memory, comprising:
performing a transparent mode test on at least one memory device of a memory module with a pseudo random data pattern, the pseudo random data pattern being generated based at least in part on memory control information received from a device not included within the memory module.

22. A hub included within a memory module for performing the method of claim 21.

* * * * *